United States Patent
Amstutz

(10) Patent No.: US 6,295,622 B1
(45) Date of Patent: Sep. 25, 2001

(54) METHOD AND APPARATUS FOR TRANSFORMING PSEUDORANDOM BINARY TEST PATTERNS INTO TEST STIMULUS PATTERNS APPROPRIATE FOR CIRCUITS HAVING 1 OF N ENCODED INPUTS

(75) Inventor: Kenneth D. Amstutz, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/206,900

(22) Filed: Dec. 7, 1998

Related U.S. Application Data

(60) Provisional application No. 60/069,228, filed on Dec. 11, 1997, and provisional application No. 60/067,864, filed on Dec. 8, 1997.

(51) Int. Cl.$^7$ .................................................. G01R 31/28
(52) U.S. Cl. ............................................ 714/724; 345/418
(58) Field of Search ...................................... 714/724, 726, 714/30, 34, 727, 728, 739; 712/200, 1; 375/240; 345/418

(56) References Cited

U.S. PATENT DOCUMENTS

| | | | |
|---|---|---|---|
| 4,468,785 | * | 8/1984 | Harris ..................................... 375/214 |
| 4,688,223 | * | 8/1987 | Motika et al. . |
| 5,043,988 | | 8/1991 | Brglez et al. . |
| 5,185,736 | * | 2/1993 | Tyrell et al. .......................... 370/509 |
| 5,239,262 | | 8/1993 | Grutzner et al. . |
| 5,497,498 | * | 3/1996 | Taylor ..................................... 345/418 |
| 5,535,331 | * | 7/1996 | Swoboda ................................. 714/45 |
| 5,574,733 | | 11/1996 | Kim . |
| 5,638,988 | | 6/1997 | Krick et al. . |

OTHER PUBLICATIONS

Cattell, et al.; One–Dimensional Linear Hybrid Cellular Automata: Their Synthesis, Properties, and Applications in VLSI Testing; http://csr.uvic.ca/home/mserra/Publications/CApaper.pdf.

\* cited by examiner

*Primary Examiner*—Albert Decady
*Assistant Examiner*—Emeka J. Amanze
(74) *Attorney, Agent, or Firm*—Booth & Wright, L.L.P.; Matthew J. Booth; Karen S. Wright

(57) ABSTRACT

The present invention comprises a number transformer that includes at least one updatable parameter, for example a ring counter, that produces an N-nary number. The N-nary number has several bits, exactly one of which has a value of one and the remaining of which have a value of zero. The number transformer also includes a masker, configured to perform a bitwise boolean AND upon the first updatable parameter and a binary number. The binary number is obtained from a linear finite state machine operating as a pseudorandom pattern generator. When several ring counters are included, multiplexers are added to select one of the ring counters. The multiplexers are controlled by a ROM, that iterates through the various test points in a circuit under test.

20 Claims, 9 Drawing Sheets

METHOD AND APPARATUS FOR TRANSFORMING PSEUDORANDOM BINARY TEST PATTERNS INTO TEST STIMULUS PATTERNS APPROPRIATE FOR CIRCUITS HAVING 1 OF N ENCODED INPUTS

This application claims the benefits of the earlier filed U.S. Provisional Application Ser. No. 60/067,864, filed Dec. 08, 1997, which is incorporated by reference for all purposes into this application. Additionally, this application claims the benefits of the earlier filed U.S. Provisional Application Ser. No. 60/069,228, filed Dec. 11, 1997, which is incorporated by reference for all purposes into this application.

BACKGROUND OF THE INVENTION

1 Field of the Invention

The present invention relates to the field of electronics, and more particularly to the field of testing of electronic devices.

2. Description of the Related Art

Electronic devices have been fabricated from CMOS technology for many years. CMOS technology is made possible by the fabrication of p-channel field effect transistors (PFETS) and n-channel field effect transistors (NFETS) on a common substrate. CMOS devices have an enormous advantage over devices fabricated according to other technologies, in that CMOS devices generally consume very low DC power and very low AC power at low frequencies.

Many logic families fabricated of CMOS technologies have been described in the literature. Static CMOS logic, domino logic, and dynamic precharge logic have been described and have become well known in the field of electronics. However, a new family, known as the N-nary logic family, has also been developed. N-nary devices are disclosed in copending applications, U.S. Pat. application. Ser. No. 09/019244, filed Feb. 5, 1998, now U.S. Pat. No. 6,069,497, entitled "Method and Apparatus for a N-Nary logic circuit using 1ofN encoding," and U.S. Pat. application. Ser. No. 09/179,330, filed Oct. 27 1998, entitled "Method and Apparatus for Logic Synchronization," now U.S. Pat. No. 6,118,304, both of which are incorporated by reference into this application.

N-nary signals are quite different from binary signals. Binary signals typically implement each bit on a distinct wire (parallel bus), or each bit one-at-a-time over a common wire (serial bus). The N-nary signals, in contrast, encode at least one bit, and in many cases more than one bit, over a group of wires. The group of wires collectively implements the N-nary signal, which can contain one bit or more than one bit.

Of the wires in an N-nary signal, however, at most one can have a high voltage. For example, in a "1-of-4" N-nary signal, four wires are used to implement two bits of information, having collectively four states. In a first state, the first wire is "hot," meaning having a high voltage. In a second state, the second wire is "hot;" in a third state, the third wire is "hot;" and in a fourth state, the fourth wire is "hot." In contrast, to achieve four distinct states in binary logic, two wires are used.

The nature of the N-nary logic family has presented certain challenges for testing. When a tester applies a test vector to an N-nary logic device, the test vector should be legal and realizable within the "rules" of N-nary logic, since testing how a device responds to stimuli that the device will never actually experience is inefficient and possibly useless. Moreover, applying test vectors that are not legal can have unpredictable results and might even damage the circuit under test, since the circuit likely was not designed to handle such signals. Unfortunately, testers have generally been designed to apply binary signals to circuits under test, and some binary signals are not legal N-nary signals. In N-nary logic, a signal is legal if the signal includes at least two wires, and no more than one of the wires may have a high logic level at any time.

Generally, N-nary numbers are the most efficient stimuli for exposing faults in N-nary circuits. N-nary numbers are formed of the collection of at least one N-nary signal. Each N-nary signal represents a "digit" or portion of the number. For example, the number "fifteen" implemented in 1-of-4 N-nary logic would require two N-nary signals, one of which represents the higher-order 1-of4 value (the two most significant bits worth of information) and the other of which represents the lower-order 1-of4 value (the least two significant bits of information).

One way to iterate through all possible test vectors is to count the numbers from 1 to the highest number that may be implemented. For example, in binary, to iterate through all possible test vectors, it is possible to count the binary numbers. Counting the binary numbers from 1 to $2^n-1$ in binary provides a value for each of n bits, and associating each of the bits with a wire of the test vector provides a logic level for the circuit under test. Similarly, in N-nary, to iterate through all possible test vectors, it is possible to count the N-nary numbers. Counting the N-nary numbers from zero to N, however, provides a value for each of N wires of the test vector, and provides a logic level for the circuit under test.

In binary, iterating through all possible binary numbers from 1 to $2^n-1$ may be accomplished through the use of an n-bit counter. An n-bit counter may be implemented by n one-bit flip-flops in sequence. However, such an n-bit counter merely iterates through all of the binary numbers from 1 to $2^n-1$ in consecutive order. To iterate through all of the binary numbers from 1 to $2^n-1$ in a non-consecutive order, other structures have been developed. One such structure is the linear finite state machine, or LFSM. LFSMs that have n cells generally have been used to produce all of the binary numbers from 1 to $2^n-1$ in a non-consecutive order. The binary numbers from 1 to $2^n31$ 1 produced by well-known LFSMs have generally been satisfactory for testing binary logic devices. For example, a circuit under test is partitioned into various test points, and each wire in a test point is associated with a distinct bit of a test vector. This is the built-in self-test (BIST) approach described in the co-pending application "Method and Apparatus For Built-in Self-test of Logic Circuitry," U.S. Pat. application. Ser. No. 09/191,183, filed Nov. 13 1998, which is incorporated by reference into this application. This approach is not necessarily true for other BIST implementations, however. Conventional BIST just hooks each cell to a primary input without partitioning per se. Other approaches used by well-known LFSMs include the LFSM producing test vectors that fully test the logic under test by achieving every possible input state (this type of testing is generally called "exhaustive testing"). More typically, however, the LFSM only generates a subset of the $2^n-1$ numbers because it takes too long to generate all of the possible numbers. Indeed, there is a whole sub-field of testing concerned with how to guarantee test coverage without testing exhaustively that is not within the scope of this disclosure.

SUMMARY

The present invention comprises a number transformer that includes an encoder that converts binary numbers to N-nary numbers. Within an N-nary number, exactly one of the bits has a value of one and all of the remaining bits have a value of zero. According to some aspects, several N-nary numbers are generated in response to a binary number. A set of encoding instance selectors defines a partitioning of the bits of the binary number and a range of bits within each partition. The encoder then converts each subset of bits of the binary number to a corresponding N-nary number, such that exactly one of the bits of each N-nary number has a value of one and all of the remaining bits of the N-nary number have a value of zero, and such that the one of the bits of each N-nary number having a value of one is within the range of bits defined by the corresponding encoding instance selector. The set of encoding instance selectors may define a test point within a circuit under test, and may be produced by an on-chip ROM.

Additionally, the present invention comprises a number transformer that includes at least one updatable parameter, for example a ring counter, that produces an N-nary number. The N-nary number has several bits, exactly one of which has a value of one and the remaining of which have a value of zero. The number transformer also includes a masker, configured to perform a bitwise boolean AND upon the first updatable parameter and a binary number. The binary number is obtained from a linear finite state machine operating as a pseudorandom pattern generator. When several ring counters are included, multiplexers are added to select one of the ring counters. The multiplexers are controlled by a ROM, that iterates through the various test points in a circuit under test.

DETAILED DESCRIPTION OF THE INVENTION

Figure 1:
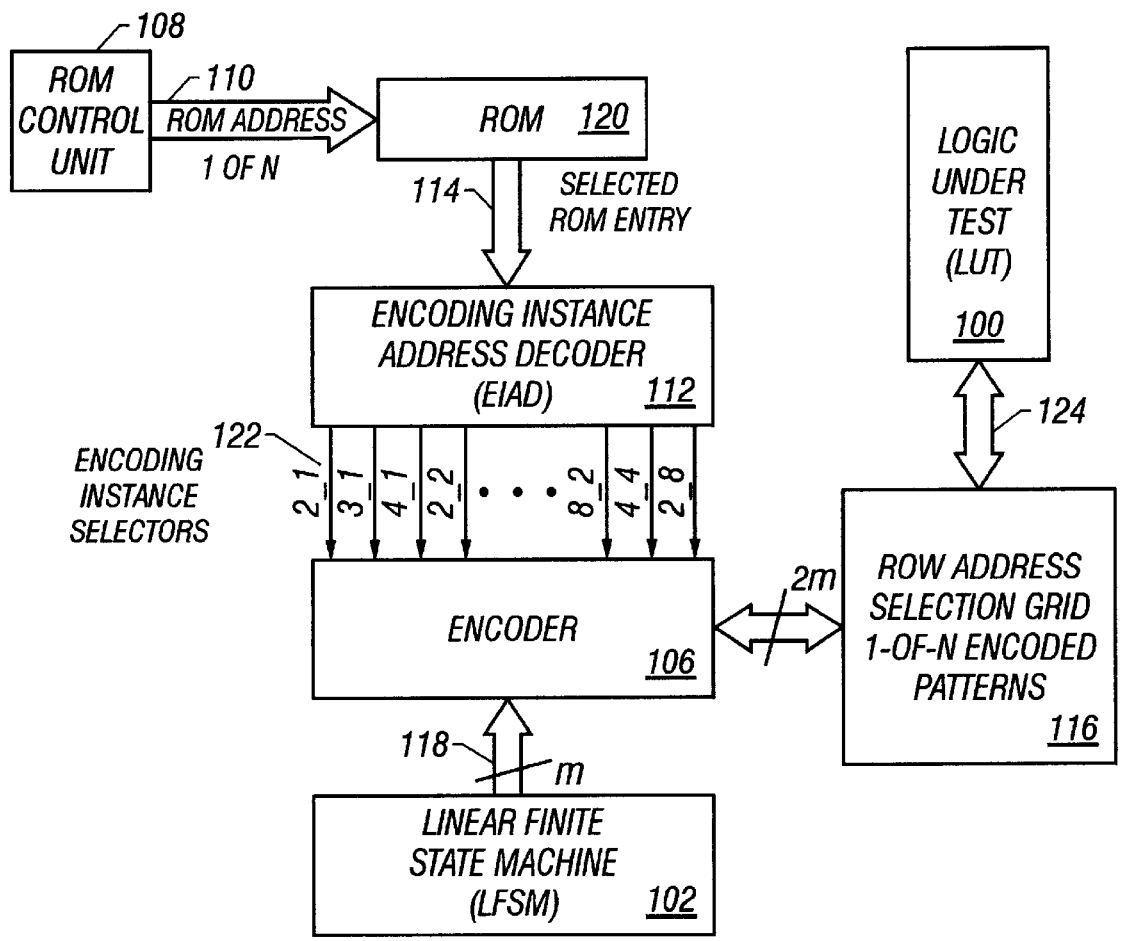
FIG. 1 shows a system according to one embodiment of the present invention.

The present invention comprises a number transformer including an encoder for transforming binary numbers into N-nary numbers, or into sets of N-nary numbers. This disclosure describes numerous specific details that include specific structures, circuits, and logic functions in order to provide a thorough understanding of the present invention. One skilled in the art will appreciate that one may practice the present invention without these specific details.

Well-known LFSMs pertain to binary logic. However, a new logic family, the N-nary logic family, requires test signals that are N-nary, not binary. The described embodiment of the present invention includes a number transformer that provides a "mapping" of binary numbers to N-nary numbers, to provide test vectors suitable for N-nary circuits. When an LFSM configured to generate binary numbers is coupled to provide the binary numbers to the number transformer, the number transformer provides pseudorandom N-nary numbers. The N-nary numbers may then be used as N-nary test vectors to test a circuit under test.

The circuit under test uses the N-nary signals to identify "stuck-at" faults, among other types of faults. "Stuck-at" faults are identified as logic gates that produce a value independent of the inputs to the logic gates. For example, a logic gate that always produces a high logic state, regardless of the input to the logic gate, has a "stuck-at-high" or "stuck at one" fault. A logic gate that always produces a low logic state, regardless of the input to the logic gate, has a "stuck-at-low" or "stuck at zero" fault. Identifying these faults is accomplished by providing an input to the logic gate that is expected to produce an output other than the output at which the logic gate is stuck.

Several types of binary logic LFSMs are well known. In order to use them to test N-nary circuits, re-mapping of the binary states to N-nary states is helpful. Binary numbers are poor test stimuli for N-nary circuits because N-nary circuits "like" N-nary numbers as input, and binary numbers contain a much higher proportion of 1 bits than N-nary numbers. N-nary numbers are the optimal stimuli for N-nary circuits because all stuck-at faults in a 1ofN gate can be detected by the N 1of N numbers.

Additionally, in the described embodiment of the present invention, the values of N are programmable, according to a mapping algorithm. The described embodiment of the present invention provides a group of N-nary signals for almost any predetermined value of N, where N is the number of wires in each N-nary signal. Moreover, the described embodiment of the present invention can be easily configured to provide a group of N-nary signals that have diverse values of N; for example, several 1-of-4 signals and a 1-of-7 signal, simultaneously. For any collection of N-nary signals, regardless of the number of different values of N across the collection, the described embodiment of the present invention iterates through every possible state each N-nary signal can possibly achieve (providing complete coverage), in a non-consecutive order.

Allowing diverse values of N solves several complications that otherwise arise when one LFSM is coupled to multiple sets of inputs. Each set of inputs may be allowed to include any number of wires, and the described embodiment of the present invention provides coverage that may be easily adapted to the particular set of inputs. Briefly, the described embodiment of the present invention includes an LFSM that produces non-consecutive binary numbers. The described embodiment of the present invention then "maps" the binary numbers to N-nary numbers for several different values of N.

There are several "constraints" that are imposed to increase the usefulness of the number transformer. The described embodiment of the present invention is specifically oriented to satisfying these constraints; it will be understood, however, that the constraints may be varied somewhat in other embodiments to provide slightly different number transformers.

Among the constraints is a desire to be both economical in terms of die area, and efficient in the use of binary numbers. It is inefficient merely to discard the binary states that do not have exactly one bit at a high logic level, because this will inflate built-in-self-test (BIST) execution times. In the described embodiment, all binary states of the LFSM result in a legal N-nary output. In other words, all states of the LFSM are "used" for N-nary pattern generation, to increase the efficiency of the number transformer.

Also, the mapping algorithm (and the selection of values of N) of the described embodiment is adaptable "on-the-fly" to different combinations of gates, with different combinations of N. Allowing for on-the-fly reprogramming of different values of N increases the usefulness of the number transformer, and allows the same number transformer to be used for different test points in the circuit under test The number transformer can even implement diverse values of N in different fields of the same test vector.

Also, the outputs of the number transformer in the described embodiment are pseudorandom N-nary numbers that are evenly distributed across the N-nary space. The latter constraint, that the n-nary numbers be evenly distributed across the N-nary space, reduces redundant testing. For example, if every invalid binary number were mapped to the same N-nary number, then that n-nary number would be more highly tested than other n-nary numbers.

In one embodiment, the number transformer partitions the output of the LFSM into fields of bits. Each field is associated with an N-nary signal, and the number of bits in the field corresponds to the number of wires in the N-nary signal. The number transformer then examines each field to determine whether the output is a valid N-nary number and may therefore be passed directly to the output of the number transformer. A field of bits is a valid N-nary number when exactly one of the bits (or, in some embodiments, when no more than one of the bits) in the field has a high logic level. If more than one of the bits in the field has a high logic level, or if none of the bits in the field has a high logic level, then the number transformer maps the bits in the field to an alternate representation in which exactly one of the bits in the field has a high logic level. On the other hand, if exactly one of the bits in the field has a high logic level, the number transformer passes the bits in the field to the output of the number transformer.

Without the number transformer between the LFSM and the circuit under test, the circuit under test may receive a multi-wire signal in which more than one of the bits in the field has a high logic level, or a multi-wire signal in which none of the bits in the field has a high logic level. Such a multi-wire signal may have unpredictable results. In contrast, with the number transformer between the LFSM and the circuit under test, the circuit under test receives only N-nary signals.

The present invention also allows for BIST. BIST for logic circuits almost always involves use of LFSMs as pseudorandom pattern generators (PRPGs) to provide a random non-sequential sequence of binary numbers, as well as multiple input serial registers (MISRs) to collect and compact the latched values of the test points.

An N-nary logic circuit under test may be considered to include several portions, each of which is driven by a distinct clock signal or phase of a clock signal. Within each portion of the circuit under test, all of the logic gates receive the same clock signal (Clocking of N-nary gates is further described in the Synchronization Patent). Various latches are inserted within the logic under test that propagate test signals through the logic under test and collect outputs from the logic under test. During testing, the logic gates receive input signals from a set of latches, and then provide outputs that are captured by another set of latches. Each of these sets of latches is referred to as a test point, the values stored in a test point are referred to as a test vector. A test point can have any number of latches.

According to the exemplary embodiment of the present invention, however, each test point input or output contains fields, each of which contains an N-nary number. Where a PRPG only has to drive a single set of inputs (i.e., the entire test vector is a single N-nary number), all the binary PRPG outputs are run through an encoding circuit that ensures legal N-nary combinations among the N-nary encoding of the inputs (e.g. 1of-4, 1of-7, 1of-12, etc.) for that single set of inputs.

Where the PRPG has to drive several sets of inputs, each input requiring a distinct N-nary number of some predetermined value of N, complications are introduced. According to the exemplary embodiment of the present invention, the binary output of the PRPG is dynamically (i.e., "on-the-fly") mapped to several different N-nary logic combinations, each of which might have a different value of N, and then provided to the appropriate test points or compared with the output read from the appropriate test point.

Moreover, the exemplary embodiment of the present invention avoids implementing an encoding circuit for each test point, which would be a costly solution in terms of die area. Rather, the exemplary embodiment of the present invention is suitable for implementation in conjunction with the scheme set forth in the co-pending application "Method and Apparatus For Built-in Self-test of Logic Circuitry."

Additionally, the exemplary embodiment of the present invention provides different values of N within a test point, and allows the logic designer to implement diverse values of N within the test point. The exemplary embodiment of the present invention does not merely implement the LFSM in an N-nary form, which would not allow test points to implement different values of N.

One advantage of the present invention is to allow flexible, on-the-fly determination of the size of each N-nary signal required at each test point. The "size" of an N-nary signal refers to the number of wires needed to implement it, and may also be referred to as the "radius," "width," or "granularity" of the N-nary signal. To provide for flexibility in implementing various sized N-nary signals simultaneously, therefore, the exemplary embodiment of the present invention implements N-nary signals on a group of wires whose number may either equal or exceed N. This group of wires is referred to as the "pitch" of the N-nary signal, and is discussed more fully below. The pitch of the N-nary signal is either equal to or greater than N.

Logic Under Test

FIG. 1 shows a system according to one embodiment of the present invention. The system includes a circuit under test, also known as the logic under test 100. The logic under test 100 has a number of test points, each of which is driven by a set of N-nary signals. The N-nary signals are not necessarily uniform in width across a test point, nor is there necessarily any relationship between the number and assortment of N-nary signals associated with one test point and the number and assortment of N-nary signals associated with another test point.

The logic under test 100 includes a number of latches that function as test registers. The use of latches as test registers is discussed in detail in the context of N-nary logic in "Method and Apparatus for Built-in-Self-Test of Logic Circuitry," as previously described. The test system may write values to one set of latches at one test point, then clock the logic under test 100 to allow the logic under test 100 to establish values at a second test point. Then, the system may read the values at the second test point.

Also shown, a bus 124 couples the logic under test to a row address selection grid 116. According to one embodiment of the present invention, a selector (not shown) between the row address selection grid 116 and the bus 124 selects one test point within the logic under test 100, and selectively couples the wires of the row address selection grid 116 to the various wires of N-nary signals of the selected test point The wires of the row address selection grid 116 receive voltages from an encoder 106. An Encoding Instance Address Decoder (EIAD) 112 provides a set of encoding instance selectors 122 to the encoder 106. The encoder 106 also receives a pseudorandom binary number 118 from a linear finite state machine 102. According to the encoding instance selectors 122, the encoder 106 maps various fields of the pseudorandom binary number 118 into a set of N-nary numbers.

A ROM control unit 108 and a ROM 120 provide a selected ROM entry 114 to the EIAD 112. The ROM control unit 108 provides a ROM address 110 that selects one of the test points in the logic under test 100. Although not shown in FIG. 1, the ROM address 110 also controls the selector between the row address selection grid 116 and the bus 124. The ROM address 110, in one embodiment, has as many bits as the logic under test 100 has test points. The ROM control unit 108 selects a test point, and identifies the selection to the ROM 120 via the ROM address 110. One embodiment of the present invention uses a 16-bit ROM entry; other embodiments could use any number of bits in the ROM entry. The 16-bit ROM entry 114 is then provided from the ROM 120 to the EIAD 112.

Row Address Select Grid

This exemplary embodiment of the present invention includes sixteen wires, according to the maximum number of wires that may be provided to any test point. The sixteen wires are collectively known as the row address selection grid 116, and are coupled to the various test points in the logic under test, via a row selector not shown in FIG. 1. Here, the term "row" and the term "test point" are used interchangeably. The row selector may be considered to include sixteen one-bit demultiplexers, each coupled to receive one wire of the row address selection grid, and to provide one wire to each test point in the logic under test. The demultiplexers are controlled by a row address 110. The row address 110 is received from the ROM control unit 108, described below. For convenience of reference, the sixteen wires of the row address select grid 116 are numbered ordinally. In the preferred embodiment of the present invention, further described below, the row address selection grid 116 has enough wires so that each test-point N-nary signal required by a row may be provided by a distinct group of wires, in which the number of wires within a group is a power of two and some wires may go unused. When a row is selected by the ROM Control Unit 108, identifying a group of wires in the row address selection grid 116 corresponds to identifying an N-nary signal in the selected row. The N-nary signals that are test points for BIST are each connected to a group of wires in the row address selection grid 116. Although the LFSM 102 produces a pseudorandom value, the value produced is binary, not N-nary. Consequently, merely associating bits of the value produced by the LFSM 102 with wires of the row address selection grid 116 is not an acceptable solution. Although the LFSM 102 is able to produce pseudorandom binary values, the encoder 106 is used to convert the pseudorandom binary values to appropriate N-nary signals.

Encoder

The encoder 106 provides a voltage on each of the wires of the row address selection grid 116. The encoder 106 generally has two functions: to ensure that the voltages that are applied to the row address selection grid 116 represent valid N-nary numbers, and to provide N-nary numbers having the correct numbers and arrangement of wires. Moreover, the encoder 106 provides several N-nary numbers as stimuli to the several N-nary signals of a selected test point.

The encoder 106 protects the N-nary logic gates of the logic under test 100 from non-N-nary signals, by converting any such signal received from the LFSM 102 to a proper N-nary signal. For each encoding instance selector 122 that is asserted to the encoder 106, the encoder 106 selects a 104 group of bits from the pseudorandom pattern 118 provided by the LFSM 102. The encoder 106 then determines whether the signal is a proper N-nary signal. If the signal is N-nary, then the encoder 106 provides the signal to the row address selection grid 116. If the signal is not N-nary, then the encoder 106 maps the signal to a proper N-nary signal and provides the mapped N-nary signal to the address selection grid 116.

The encoder 106, in effect, determines whether pulling the wires of the row address select grid 116 to the voltage determined by the corresponding bit of the pseudorandom pattern 118 would cause more than one wire of any N-nary signal to carry a high voltage. The encoder 106 provides either a high voltage or a low voltage to each wire on the row address selection grid 116 upon each clock cycle within the BIST cycle.

According to one embodiment of the present invention, which is not a preferred embodiment, when the encoder 106 receives binary numbers that are not valid N-nary numbers, the encoder 106 merely discards the binary number and waits to receive the next binary number from the LFSM. This embodiment is highly inefficient, since only a few binary numbers map to valid N-nary numbers.

According to another embodiment of the present invention each row of the logic under test is known to require the same type of signals. And each row is known to require the same number of signals of the same width. According to this embodiment, the LFSM is implemented in N-nary form. An LFSM is implemented in N-nary form when the characteristic polynomial is such that every binary number provided by the LFSM is also a valid N-nary number. In general, the only binary numbers that are valid N-nary numbers are powers of two; the LFSM is constructed to prevent the LFSM from generating any other binary numbers. While such an embodiment may be useful in some limited situations, in general the limitation that each row of the logic under test is known to require the same type of signals is too restrictive to make this embodiment useful.

According to another embodiment of the present invention a set of predetermined valid N-nary numbers is determined for each row, and any binary number that is not a valid N-nary number is replaced by the predetermined valid N-nary number. For example, if a 1 of5 signal is required to stimulate a test point, and the 1of5 signal were implemented on a pitch of eight wires, the mapping could be done crudely by ensuring that any 8-bit binary number for which the first five bits were not a legal 1of5 number would be remapped to a single, arbitrary 1 of5 number would be, say, 10000. In other words, the encoder 106 is implemented according to the following statement:

IF ((first five bits!=10000) AND (first five bits!=01000) AND (first five bits!=00100) AND (first five bits!=00010) AND (first five bits!=00001))

THEN OUTPUT=10000.
where"!" indicates negation in the above.

The problem with this approach is that $2^8$ is 256; there are 256 different 8-bit binary numbers. Only 40 of those numbers have a legal 1 of5 number as their first five bits; the remaining 216 numbers would be remapped to 10000. This crude mapping scheme badly skews the distribution of test stimuli toward 10000: there are 8 binary numbers for which the gate receives 00001 as stimulus, 8 binary numbers for which the gate receives 00010, 8 binary numbers for which the gate receives 00100, and 8 binary numbers for which the gate receives 01000, but for any of the remaining 224 binary numbers the gate would receive 10000 as stimulus.

The reason this is not a preferred approach is that a PRPG generates binary numbers in random order, or at least pseudorandom order. The more evenly we remap illegal binary numbers to legal N-nary numbers, the fewer BIST cycles will be required to cover all the N-nary states. Ideally, one fifth of the 8-bit binary numbers should produce 10000 as an N-nary stimulus, another fifth should produce 01000, another fifth should produce 00100, another fifth should produce 00010, and the remaining fifth should produce 00001.

According to another embodiment of the present invention, referred to hereinafter as the "Weighted Binary Output Embodiment," one entry is stored for each test point, or each unique set of inputs to be driven by the PRPG. The entries are stored in a ROM. Each ROM entry, selected whenever the corresponding test point is addressed, selects one of several ring counters, each of which contains a certain number of one bits. These ring counters act as masks, being ANDed against the output of the PRPG. The selection of the ring counter therefore serves to weight, although not to precisely determine, the number of 1 bits in the test stimulus.

Figure 7:
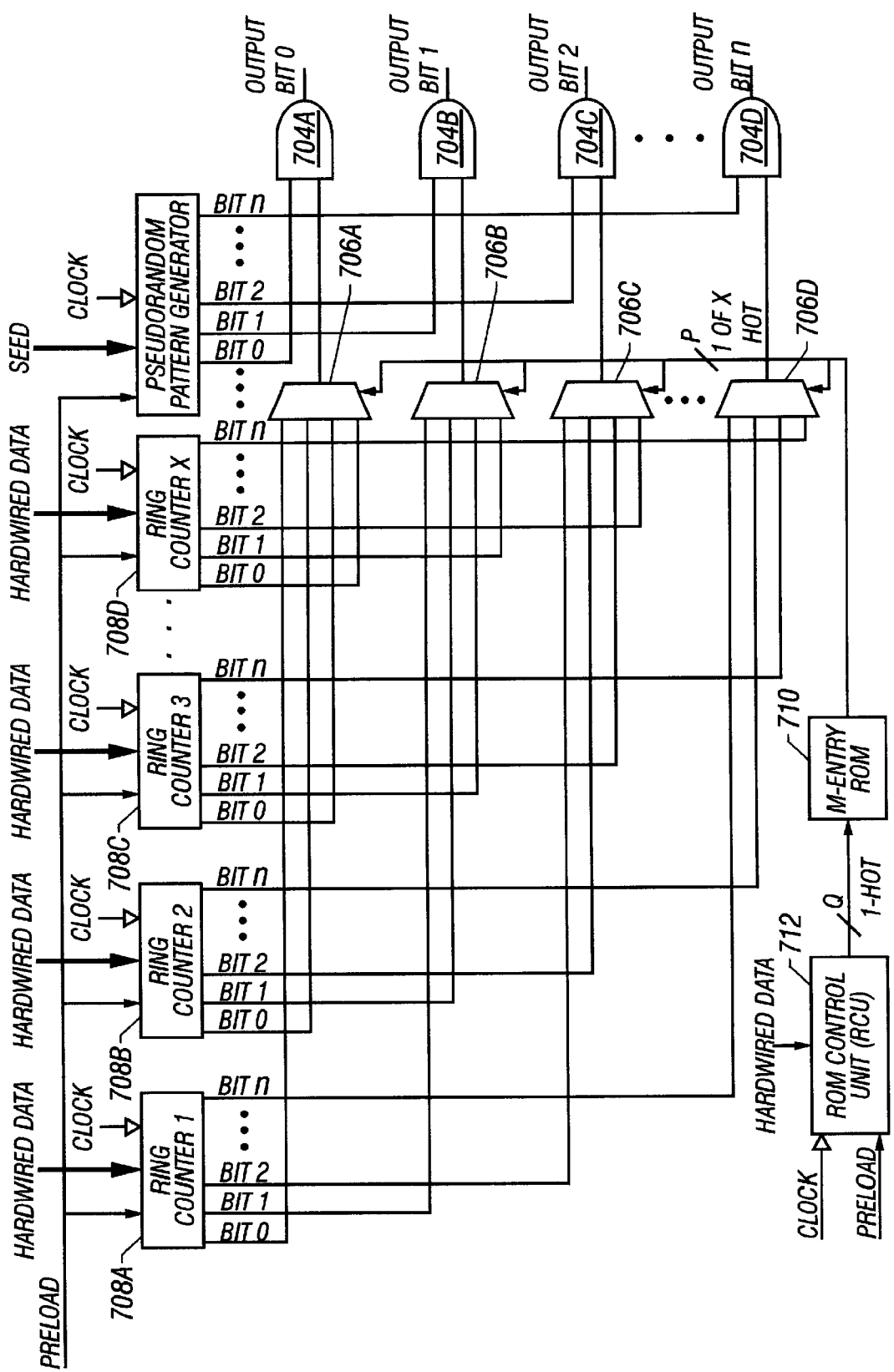
FIG. 7 illustrates an embodiment of the present invention for a weighted binary output.

FIG. 7 shows a number transformer according to the weighted binary output embodiment. A pseudorandom pattern generator 702 generates an n-bit binary pseudorandom pattern. The n-bit binary pseudorandom pattern generate or generates $2^n-1$ states in non-consecutive order. The n-bit binary pseudorandom pattern is provided to a series of 2-input boolean AND gates 704a–704d. The adders allow a mask to be implemented over the n-bit binary pseudorandom pattern. The mask has n bits, like the binary pseudorandom pattern, and is implemented on n 2-input boolean AND gates 704a–704d.

The mask is provided by a set of multiplexers 706a–706d. The multiplexers 706a–706d each provide a bit to a corresponding adder among adders 704a–704d. By providing bits that have a value of zero, the multiplexers 706a–706d are able to suppress a bit of the binary pseudorandom pattern that has a value of one.

To provide an n-bit mask, n multiplexers 706a–706d are used. Each of the multiplexers 706a–706d, however, receives X input signals, and selects one of the inputs signals to provide a corresponding bit of the mask.

The mask is designed such that, of the n bits of the mask, exactly one bit has a value of one and all of the remaining bits have a value of zero. In other words, exactly one of the multiplexers 706a–706d has an output of one, and all of the remaining multiplexers 706a–706d have an output of zero. To accomplish this, the multiplexers 706a–706d are used merely to select from among various sources that produce outputs having exactly one bit of value equal to one, and all the remaining bits having value equal to zero.

Ring counters 708a–708d each produce an n-bit binary number having exactly one bit of value equal to one, and all the remaining bits having value equal to zero. To produce the mask, the multiplexers 706a–706d merely select one of the ring counters 708a–708d and map the n-bit value produced by the selected ring counter 708a–708d into the mask. The number transformer according to the weighted binary output embodiment of the present invention includes X ring counters, allowing the multiplexers 706a–706d a selection of sources for n-bit N-nary numbers.

For the described embodiment, n has a value of 16. In other words, the pseudorandom pattern generator 702 produces a 16-bit binary number each clock cycle. Consequently, the mask also has 16 bits. As a potential source for the mask, each of the ring counters produces a 16-bit number.

Each ring counter 708a–708d is a 16 bit ring counter, cycling through 16 states. Upon each state, the bits of a ring counter shift one position, such that over 16 clock cycles, the ring counters return to their original states. Each ring counter 708a–708d also includes hard wired data, allowing the ring counters to return to a known starting position after power-up or reset. The hard wired data of a ring counter establishes a reset value. The reset value of a ring counter is the initial value the ring counter assumes immediately after a reset.

The select to all of the multiplexers 706a–706d is provided by an M-entry ROM 710. For example, the M-entry ROM 710 may be used to select a test point in a circuit under test that has M test points. Accordingly, each test point would be associated with a distinct ring counter as the M-entry ROM 710 iterates through the test points. If the number of test points and the number of ring counters have no common factors, then each cycle through the M test points would associate a given test point with a different ring counter.

The M-entry ROM 710 is controlled by a ROM Control Unit (RCU) 712. The ROM Control Unit (RCU) 712 selects a test point from among the M test points. The ROM Control Unit 712 also has hard wired data, allowing the ROM Control Unit to return to a known starting position after power-up or reset The hard wired data of the ROM Control Unit establishes its reset value. The reset value of the ROM Control Unit is the initial value the ROM Control Unit assumes immediately after a reset.

The ROM Control Unit 712 is clocked and has a preload. The preload allows the ROM Control Unit 712 to be set to a user-determined value other than the value indicated by the hardwired data, and without clocking the ROM Control Unit 712 until the user-determined value is reached. The user-determined value may, of course, be a value the ROM Control Unit 712 may never reach without preloading. The clocking of the ROM Control Unit 712 allows the ROM Control Unit 712 to transition from one state to another synchronously with the other elements shown in FIG. 7.

Constraints on Pitch

According to the preferred embodiment of the present invention, the particular portion of the circuit that is tested is selectable on the fly, and may include any number of N-nary signals and a diversity of values of N. Accordingly, some general constraints are introduced to illustrate the exemplary embodiment of the present invention. These constraints are not in any way limiting, but do imply some knowledge of the circuit under test. It should be remembered that the various portions of the circuit under test receive N-nary signals, that these N-nary signals implement valid N-nary numbers, and that these N-nary numbers are received from the number transformer.

The first constraint is to establish that each N-nary signal provided from the number transformer to the cells of the on-chip test register is implemented on a pitch that is a power of two. In other words, each N-nary signal provided from the number transformer to the cells of the on-chip test register is implemented on either 2 wires, 4 wires, 8 wires, or 16 wires, or some other number of wires that is a power of two. This constraint identifies only a physical characteristic of the preferred embodiment of the present invention; it is not intended to describe a limitation. N-nary signals to a particular test point may still have other widths, such as 1-of-5 or 1-of-7. Additional wires are merely added that are not used for that test point, so that wider N-nary signals may be provided to other test points without additional hardware. For example, the 1-of-5 signal is implemented on a first pitch of eight wires, and the 1-of-7 signal is implemented on a second pitch of eight wires. N-nary signals may not share a pitch of wires; two 1-of-5 signals require a total of sixteen, not ten wires.

Another constraint is to determine the maximum number of wires that may be provided to any test point, when each N-nary signal is considered distinct. For purposes of illustration, the maximum number of wires that may be provided to any test point in the described embodiment is determined to be sixteen. This constraint, also, is not limiting. If a logic designer has any concern that a larger N-nary signal may be needed to test the circuit, or that a larger number of N-nary signals may be needed to test the circuit, then the logic designer will merely increase the number of wires used. For example, the exemplary embodiment of the present invention may be implemented with 32 wires without departing from the present invention.

When fabricating the chip, each test point is connected to the wires of the row address selection grid 116. If a test point requires a 1-of-5 signal and a 1-of-7 signal, the first five wires of the row address selection grid 116 may be connected to provide the 1-of-5 signal, the next three left unused as don't cares (to provide a pitch of eight wires), the next seven connected to provide the 1-of-7 signal, and the next one left unused (again, to provide a pitch of eight wires).

For example, a row of logic under test 100 may contain a 1-of-7 signal, a 1-of-3 signal, and a 1-of-4 signal, as test points. The 1-of-7 signal may be connected to the first eight wires of the row address select grid 116, the 1-of-3 signal may be connected to the next four wires of the row address select grid 116, and the 1-of-4 signal may be connected to the remaining four wires of the row address select grid 116. In such a case, a permissible implementation would connect the 1-of-7 signal to wires 1–7; the 1-of-3 signal may be implemented on wires 9–11; and the 1-of-4 signal be implemented on wires 13–16, with wire 8 and wire 12 unused.

To reduce the complexity somewhat, according to one aspect of the invention, each N-nary signal serving as a test point is connected to the group of wires in a "left-justified manner." Any form of justification may be used so long as it is done consistently "left-justified" is chosen for exemplary purposes only). In other words, if the wires of the row address selection grid 116 are numbered from 1 to 16, within each group the lower-numbered wires are preferred. If an N-nary signal has fewer wires than the group of wires in the row address selection grid 116 to which it is connected, then the higher-numbered wires go unused. This aspect of the invention imposes some simplifying topological constraints that do not reduce the usefulness of the present invention.

In other words, according to the preferred embodiment of the present invention, hereinafter referred to as the "Purely N-nary Embodiment," two restrictions are placed on the placement of N-nary gates within a row that are not too onerous and costly, yet allows us to map binary PRPG outputs to all the possible combinations of N cost-effectively. (It will be recalled that the wires of the row address selection grid 116 are numbered ordinally.) The first restriction requires that if N is a power of 2 for a given gate, that gate must be placed on a pitch of N wires. For example, if the first logic gate driven by a test point requires a 1-of-4 input, the row address selection gird 116 must have exactly four wires associated with the test point.

Having imposed these restrictions, one can compute, for all possible combinations of N within a given row, a compact "code" that represents the values of N and where they are placed in the row. These codes are stored in a ROM. Whenever it is necessary to write data to row K, one addresses row K's code in the ROM; the output of the ROM (the row K code) drives the inputs of encoding circuitry which basically ensures that only 1 wire within each group of N on row K gets driven high.

Read Only Memory (ROM)

Figure 5:
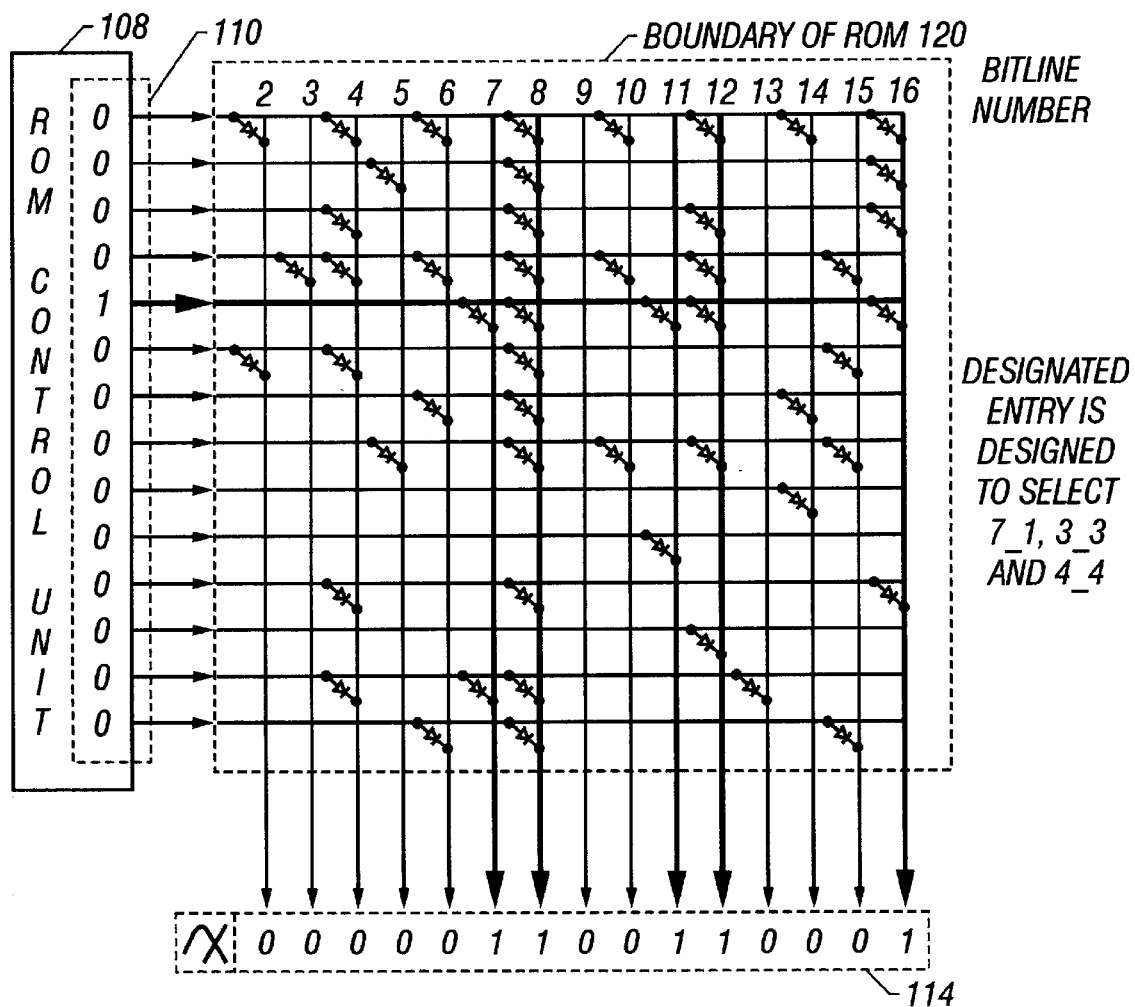
FIG. 5 shows a ROM unit and ROM control unit (RCU) structure, according to the embodiment of the present invention of FIG. 1.
Figure 6A:
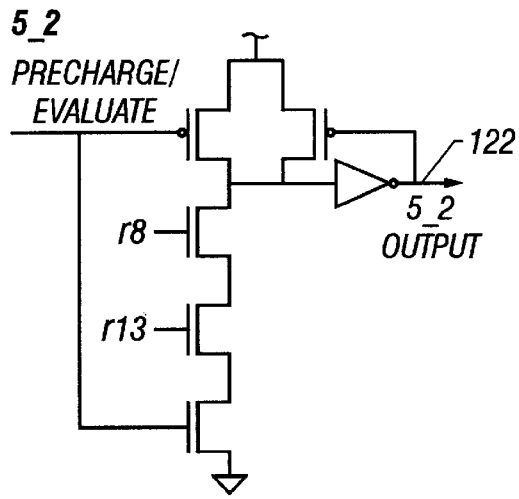
FIG. 6 shows a transistor-level implementation of the Encoding Instance Address Decoder (EIAD), according to the embodiment of the present invention of FIG. 1.
Figure 6B:
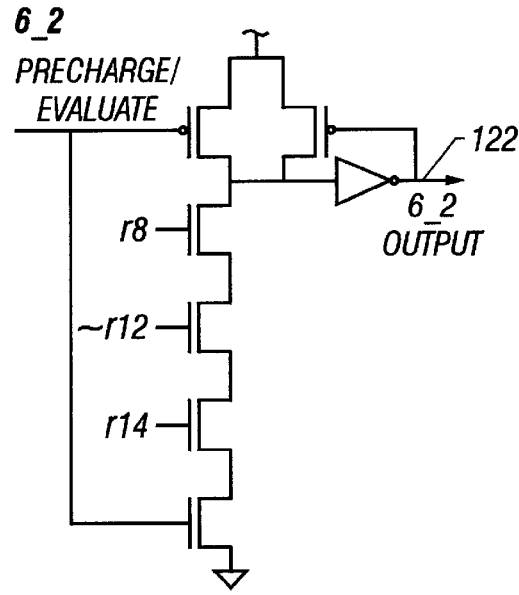
Figure 6C:
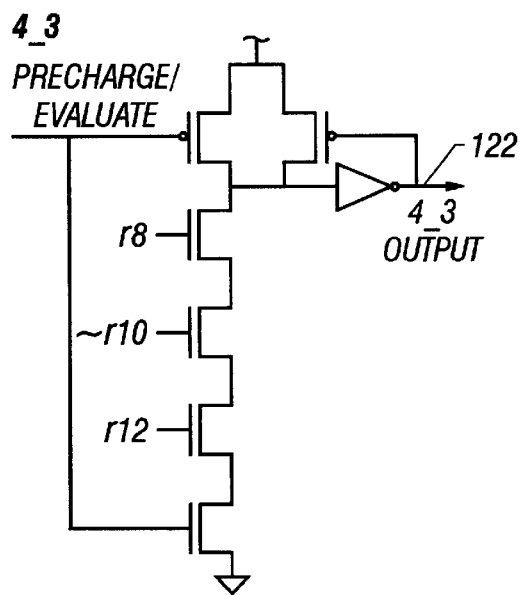
Figure 6D:
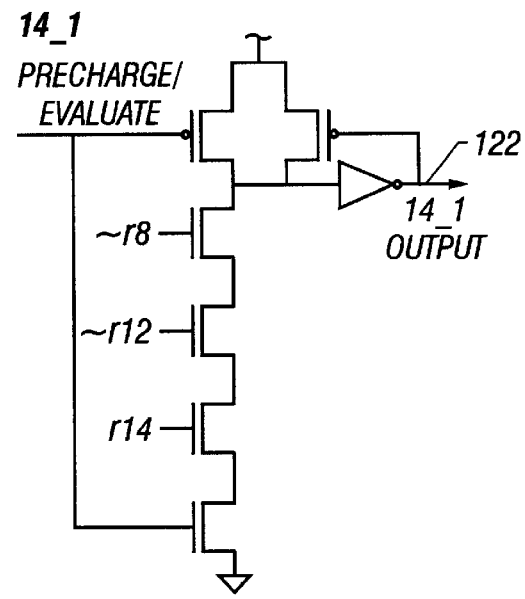

Referring now to FIG. 5, a ROM unit 120 and ROM control unit (RCU) 108 structure is shown, demonstrating how the ROM entry 114 is generated. Each horizontal line in the FIG. 5 corresponds to a row in the logic under test. Each vertical line in the FIG. 5 corresponds to a bit of the ROM entry 114. The value across the bottom of FIG. 5 illustrates an example of a valid ROM entry 114. Diodes are used to draw particular bits of the ROM entry 114 to a logical high value, while pull down resisters draw the remaining bits to a logical low. The ROM control unit value shown to the left on FIG. 5 is the row address 110, selecting a particular row of the logic under test 100.

As shown in FIG. 5, a ROM unit 120 reads a row address 110 from the ROM control unit 108. The row address 110 is a binary number having a number of bits equal to the number of rows in the logic under test 100. Exactly one bit of the row address 110 has a value of 1, and all the remaining bits of the row address 110 have a value 0.

Based upon the row address 110, the ROM unit 120 provides a ROM entry 114 by performing a look-up table function. Recall that the ROM control unit 108 and the ROM unit 120 are customized for a logic under test 100. When a row address 110 is available from the ROM control unit 108, the ROM provides a customized ROM entry 114 for the logic under test 100 identified by the row address 110.

The ROM entry 114 is a 16-bit value, for example, that may be regarded as containing at least one field. Each field has a number of bits, or "pitch," that is a power of two. A field may contain two bits, four bits, eight bits, or sixteen bits. It will be understood that, although described as a 16-bit value, the ROM entry 114 may be implemented as a 32-bit value, or any power of 2, if the row address selection grid 116 has 32 wires, without departing from the present invention. Preferably, the ROM entry 114 has the same number of bits as the row address selection grid 116 has wires.

The fields of the ROM entry 114 correspond to the groups of wires in the row address selection grid 116. The field of the ROM entry 114 has a pitch equal to the pitch of the corresponding group of wires in the row address selection grid 116. The pitch (both the number of bits in the ROM entry 114 field, and the number of wires in the row address selection grid 116) is a power of two. Also, the order of the bits in the ROM entry corresponds to the order of the wires in the row address selection grid 116. Consequently, when a group of wires is defined adjacently to the left of another group of wires, the corresponding field of bits in the ROM entry 114 may be defined as "previous" to the field of bits correspond to the other group of wires.

Each field in the ROM entry 114 ends in a one. Each field begins with a one if the previous field has a number of bits that is not a power of two. Each field begins with a zero if the previous field has a number bits that is power of two. In this manner, the connection between a group of wires in the row address selection grid 116 and an N-nary signal in the selected row of the logic under test 100, is described by a field of the ROM entry 114.

For any given row, the value of the ROM entry 114 describes the connection between the row address selection grid 116 and the selected row of the logic under test 100. The fields of the ROM entry 114 do not overlap and collectively span the ROM entry 114. The ROM entry 114 is used within the encoder 106 to control the mapping of signals representing binary numbers from the LFSM 102 to signals representing N-nary numbers to the logic under test 100. As previously described, N-nary signals implement more wires than bits. An N-nary signal using four wires (i.e., a 1-of-4 signal) has four states, while a binary signal using four wires has sixteen states.

Figure 2:
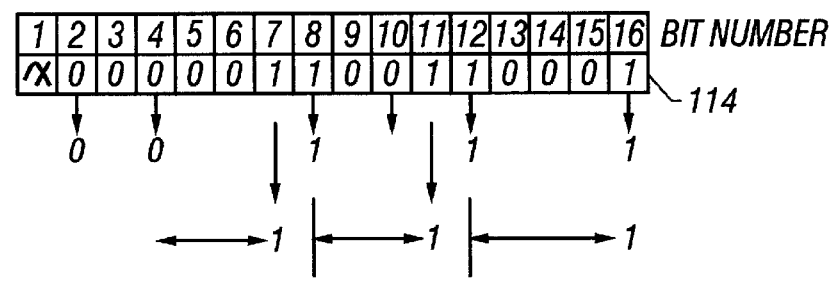
FIG. 2 shows an encoding of a value, according to the embodiment of the present invention of FIG. 1.

FIG. 2. shows the encoding of a ROM value 114, according to one embodiment of the present invention. Recall that, during fabrication of the encoder 106 according to the constraints placed on the encoding, each N-nary signal to be provided to the logic under test 100 is coupled to a pitch of wires in the row address selection grid 116 that has a number of wires that is a power of two. In other words, each N-nary number is encoded on a group of wires having either 2, 4, 8, or 16 wires. This mapping is described within the ROM 120.

During operation of the system of FIG. 1, a test point is selected by the ROM control unit 108. The test point is identified in the ROM address 110. The ROM address causes the ROM 120 to generate a ROM entry 114 describing the assortment of N-nary signals needed to stimulate, or which is to be read from, the test point identified in the ROM address 110. In the example shown in FIG. 5 and FIG. 2, the ROM entry 114 is 000001100110000.

This EIAD 112 receives the ROM entry 114 and determines the nature of the connection between the test point and the row address selection grid 116. For each value of n, the 2$^n$th bit is examined to determine whether a value is encoded on the particular field. In other words, the ROM entry 114 is examined on power-of-two boundaries.

As further shown in FIG. 2, when the ROM entry 114 is x00001100110000 (where x is a place holder value as illustrated in FIG. 5), the EIAD 112 determines that bit 2 has a value of zero, bit four has a value of zero, and bit eight has a value of one. Therefore, because the field size must be a power of two, and the field must end with a 1, the first field is 8 bits long, and corresponds to a pitch of 8 wires on the row address selection grid 116. The field comprising the first eight bits is then examined to determine whether any other bits within the first eight bits has a value of one as well. If not, then the first eight bits are determined to implement a 1-of-8 signal. The EIAD 112 then determines that bit seven has a value of one. Bit seven and no other bits in the first field (other than bit 8) stipulate that a 1-of-7 signal is implemented, in the first field in which it is possible to implement a 1-of-7 signal. The connection of each N-nary signal to the test points designated by the ROM entry can be further described by two numbers: a signal width, and a signal position. These two numbers, separated by an underscore, constitute the encoding instance selector. The signal width is the actual number of wires required to implement the N-nary signal. The signal position is the location of the pitch in which the signal is accommodated, assuming that the entire ROM entry for the row selected calls only for N-nary signals of the same width. In other words, the signal position for any particular pitch of wires is determined without regard to the actual implementation of signals on the other wires. The encoding instance selector for the first pitch of wires described in FIG. 2 is therefore $7_{13}$ 1.

Returning to FIG. 2, the remaining bits of the ROM entry 114, i.e., bits 9 to 16, are then examined. Bit 10("bit 2" of the remaining bits) is zero, but bit 12 ("bit 4" of the remaining bits) is one. Therefore, again because the field size must be a power of two, and the field must end with a 1, the EIAD 112 determines that the second field is 4 bits long, corresponding to a pitch of 4 wires on the row address selection grid 116. The field comprising the bits 9 to 12 is then examined to determine whether any other bits within these bits has a value of one as well. If not, then the bits 9 to 12 are determined to implement a 1-of-4 signal. The EIAD 112 then determines that bit 11 has a value of one. Bit 11 is interpreted as bit three of a second field. The EIAD 112 also determines that no other bits in the second field (other than bit 11) have a value of one and concludes that a 1-of-3 signal is implemented on bits 9 to 12. If the ROM entry 114 had only encoded 1-of-3 signals, bits 9 to 12 would be in the third position in which 1-of-3 signals may be encoded. The signal position for the encoding instance selector is therefore 3. The encoding instance selector for this pitch of wires is therefore 3__3.

The 1-of-3 signal is implemented on a pitch of wires numbered 9 to 12. The remaining bits of the ROM entry 114, i.e., bits 13 to 16, are then examined. Bit 14 ("bit 2" of the remaining bits) is zero, but bit 16 ("bit 4" of the remaining bits) is one. Therefore, the third field is 4 bits long. The field comprising the bits 13 to 16 is then examined to determine whether any other bits within these bits has a value of one as well. If not, then the bits 13 to 16 are determined to implement a 1-of-4 signal. The EIAD 112 then determines that no bit in the range of bit 13 to 15 has a value of one. The EIAD 112 also determines that no other bits in the first field (other than bit 16) has a value of one and determines that a 1-of-4 signal is implemented on bits 13 to 16. If the ROM entry 114 had only encoded 1-of-4 signals, bits 13 to 16 would be in the fourth position in which 1-of-4 signals may be encoded. The encoding instance selector for this pitch of wires is therefore 4__4.

Table I shows how the wires corresponding to the N-nary signals needed to stimulate various gates are allocated among the sixteen wires of the row address selection grid 116. The ROM entry 114 may be regarded as a columnated sum of the rows of Table I that corresponds to the encoding instance selectors that describe the particular connection for any addressable test point.

TABLE I

| N | Pitch | location | x | 2 | 3 | 4 | 5 | 6 | 7 | 8 | 9 | 10 | 11 | 12 | 13 | 14 | 15 | 16 | Selector |
|---|---|---|---|---|---|---|---|---|---|---|---|---|---|---|---|---|---|---|---|
| 2 | 2 | 1 |   | 1 |   |   |   |   |   |   |   |   |   |   |   |   |   |   | 2__1 |
| 3 | 4 | 1 |   |   |   | 1 |   |   |   |   |   |   |   |   |   |   |   |   | 3__1 |
| 4 | 4 | 1 |   |   | 0 |   | 1 |   |   |   |   |   |   |   |   |   |   |   | 4__1 |

TABLE I-continued

| N | Pitch | location x | 2 | 3 | 4 | 5 | 6 | 7 | 8 | 9 | 10 | 11 | 12 | 13 | 14 | 15 | 16 | Selector |
|---|---|---|---|---|---|---|---|---|---|---|---|---|---|---|---|---|---|---|
| 2 | 2 | 2 |  | 1 |  | 1 |  |  |  |  |  |  |  |  |  |  |  | 2_2 |
| 5 | 8 | 1 |  |  |  |  | 1 |  |  |  |  |  |  |  |  |  |  | 5_1 |
| 6 | 8 | 1 |  |  | 0 |  | 1 |  |  |  |  |  |  |  |  |  |  | 6_1 |
| 2 | 2 | 3 |  |  | 1 |  | 1 |  |  |  |  |  |  |  |  |  |  | 2_3 |
| 7 | 8 | 1 |  |  | 0 |  |  | 1 |  |  |  |  |  |  |  |  |  | 7_1 |
| 3 | 4 | 2 |  |  | 1 |  |  | 1 |  |  |  |  |  |  |  |  |  | 3_2 |
| 8 | 8 | 1 |  |  | 0 |  | 0 |  | 1 |  |  |  |  |  |  |  |  | 8_1 |
| 2 | 2 | 4 |  |  |  |  | 1 |  | 1 |  |  |  |  |  |  |  |  | 2_4 |
| 4 | 4 | 2 |  |  | 1 |  | 0 |  | 1 |  |  |  |  |  |  |  |  | 4_2 |
| 9 | 16 | 1 |  |  |  |  |  |  |  | 1 |  |  |  |  |  |  |  | 9_1 |
| 10 | 16 | 1 |  |  |  |  |  |  |  | 0 | 1 |  |  |  |  |  |  | 10_1 |
| 2 | 2 | 5 |  |  |  |  |  |  |  | 1 | 1 |  |  |  |  |  |  | 2_5 |
| 11 | 16 | 1 |  |  |  |  |  |  |  | 0 |  | 1 |  |  |  |  |  | 11_1 |
| 3 | 4 | 3 |  |  |  |  |  |  |  | 1 |  | 1 |  |  |  |  |  | 3_3 |
| 12 | 16 | 1 |  |  |  |  |  |  |  | 0 |  | 0 | 1 |  |  |  |  | 12_1 |
| 2 | 2 | 6 |  |  |  |  |  |  |  |  | 1 | 1 |  |  |  |  |  | 2_6 |
| 4 | 4 | 3 |  |  |  |  |  | 1 |  | 0 |  | 1 |  |  |  |  |  | 4_3 |
| 13 | 16 | 1 |  |  |  |  |  |  |  | 0 |  |  |  | 1 |  |  |  | 13_1 |
| 5 | 8 | 2 |  |  |  |  |  |  |  | 1 |  |  |  | 1 |  |  |  | 5_2 |
| 14 | 16 | 1 |  |  |  |  |  |  |  | 0 |  |  | 0 |  | 1 |  |  | 14_1 |
| 2 | 2 | 7 |  |  |  |  |  |  |  |  |  |  | 1 |  | 1 |  |  | 2_7 |
| 6 | 8 | 2 |  |  |  |  |  | 1 |  |  |  |  | 0 |  | 1 |  |  | 6_2 |
| 15 | 16 | 1 |  |  |  |  |  |  |  | 0 |  |  | 0 |  |  | 1 |  | 15_1 |
| 7 | 8 | 2 |  |  |  |  |  | 1 |  |  |  |  | 0 |  |  | 1 |  | 7_2 |
| 3 | 4 | 4 |  |  |  |  |  |  |  |  |  |  | 1 |  |  | 1 |  | 3_4 |
| 16 | 16 | 1 |  |  |  |  |  |  |  | 0 |  |  | 0 |  | 0 |  | 1 | 16_1 |
| 8 | 8 | 2 |  |  |  |  |  | 1 |  |  |  |  | 0 |  | 0 |  | 1 | 8_2 |
| 4 | 4 | 4 |  |  |  |  |  |  |  |  |  |  | 1 |  |  |  | 1 | 4_4 |
| 2 | 2 | 8 |  |  |  |  |  |  |  |  |  |  |  |  | 1 |  | 1 | 2_8 |

Encoding Instance Address Decoder

Referring again to FIG. 1, the EIAD 112 receives the 16-bit ROM entry 114, and converts the 16-bit ROM entry 114 into another format, implemented as a set of 32 encoding instance selectors 122. Any possible collection of N-nary signals that may be implemented according to the aforementioned constraints on sixteen wires has a corresponding subset of the encoding instance selectors 122. The EIMD 112, in effect, "informs" the encoder 106 as to the nature of the N-nary signals required to stimulate the test point, and determines a logical function that may be applied within the encoder 106 to a binary number generated by the LFSM 102. It will be apparent upon reference to the disclosure of the present invention that the EIAD 112 may be combined with encoder 106.

As described with reference to the ROM unit, for any given row, the value of the ROM entry 114 describes the connection between the row address selection grid 116 and the selected row of the logic under test 100. Similarly, the encoding instance selectors 122 collectively describe the connection between the row address selection grid 116 and the selected row of the logic under test 100. Each field of the ROM entry 114 corresponds to one of a group of encoding instance selectors 122, each of which is implemented on a distinct wire. The ROM entry 114 may contain 1 to 8 fields; consequently, up to eight encoding instance selectors 122 may be asserted. Referring now to FIG. 6, a transistor-level implementation of the EIAD 112 is shown. The EIAD 112 receives the 16 bits of the ROM entry 114, and then selects up to eight of the 32 encoding instance selectors 122. The 16 bits of the ROM entry 114 are represented as bits 0–9 and bits a-F, according to standard hexadecimal notation. FIG. 6 illustrates the generation of four of the encoding instance selectors 122, according to particular bits of the ROM entry 114.

As described above, the connection of each N-nary signal to the test points via the wires in the row address selection grid may be described by two numbers: a signal width, and a signal position. Referring to FIG. 6 and to Table 1, the encoding instance selectors 122 are each represented by two numbers separated by an underscore. These two numbers are the signal width and a signal position.

The signal width is the number of wires in the N-nary signal. For example, if a 1-of-6 signal is encoded within the row address selection grid 116 on 8 wires, then the signal width is 6, since the signal is a 1-of-6 signal. As described below with respect to the encoder 106, the signal width is also referred to as the "encoding factor." If the signal width is a power of two, it is equal to the pitch; if not, the pitch is the next higher power of two.

The signal position is one greater than the number of N-nary signals that may be accommodated to the left of the particular N-nary signal where "to the left" refers to wires having a lower ordinal number. The position of each signal within the row address selection grid 116 must be determined as though all the signals on the row address selection grid were of the same width. In other words, position is determined without regard to the actual implementation of signals on other wires.

In the example described in connection with FIG. 2, if a 1-of-7 signal is accommodated in the first eight wires, then the position of the 1-of-7 signal is one, since nothing can be accommodated to the left of it. If a 1-of-3 signal is accommodated in the next four wires, i.e. wires 9–12, then the 1-of-3 signal has a position of three, since two other 1-of-3 signals could replace the signals to the left of the 1-of-3 signal. The 1-of-7 signal may be encoded as 7_1, while the 1-of-3 signal may be encoded as $3_{13}$ 3. If a 1-of-4 signal is accommodated in the next four wires, i.e., wires 13–16, then the 1-of-4 signal has a position of four, since three other 1-of-4 signals could be implemented on wires to the left of wires 13–16; the 1-of-4 signal may be encoded as 4_4.

Referring to Table 1, the signal widths and signal positions are combined to form an encoding instance. Once the encoding instances for all the N-nary signals connected to the row address select grid 116 have been determined, the ROM entry 116 may be calculated by summing the bits in the rows of Table 1 corresponding to the encoding instances that are included.

Referring again to FIG. 1, the encoder 106 receives the 16-bit pseudorandom pattern 118 from the LFSM 102, and the various encoding instance selectors 122 from the EIAD 112, and provides voltages to the sixteen wires of the row address selection grid 116. The row address selection grid 116 responds by providing voltages to the wires of the N-nary signals within the logic under test 100.

The encoder 106 then identifies the "encoding factor" for the group of wires. The encoding factor is the signal width, i.e. the number of wires needed to implement the N-nary signal within the logic under test 100.

Once the encoding factor is determined, the pitch is determined. The pitch is equal to the encoding factor if the encoding factor is a power of two; otherwise, the pitch is the next higher power of two. Once the pitch is determined, the individual instance is determined. The individual instance indicates which group of wires having the determined pitch is used to implement the N-nary signal. Once the encoder 106 has determined the various pitches and instances of the signals to be provided to the test point selected, the sixteen wires of the row address selection grid 116 are ready to accept their appropriate voltages to implement the appropriate N-nary number mapped from the binary number generated by the LFSM 102.

For example, a circuit under test within the logic under test 100 may have a row that includes two logic gates, each receiving two 1-of-3 signals. Such a row may be fully driven by twelve wires. For such a row, the row address select grid 116 contains four "don't-care" wires.

The encoder 106, moreover, may be implemented to provide the particular signals to the row address select grid 116. The constraints allow the test points of each row of the logic under test 100 to be connected to the row address selection grid 116 with a minimum of unnecessary switching. For example, if a row of the logic under test 100 contains two logic gates, each of which receives two 1-of-3 signals, then the entire row may be driven with twelve wires.

Figure 3A:
FIGS. 3A through 3N show the encoding of a field within the pseudorandom pattern to produce the corresponding field of the encoded pattern, according to the embodiment of the present invention of FIG. 1.
Figure 3A:
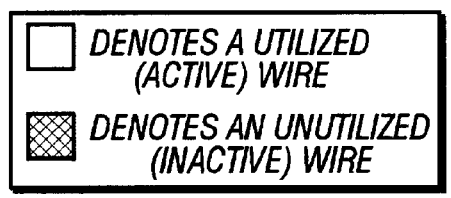
Figure 3B:
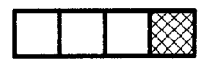
Figure 3B:
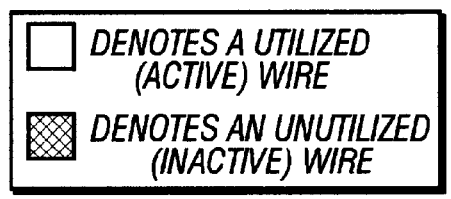
Figure 3C:
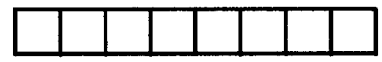
Figure 3C:
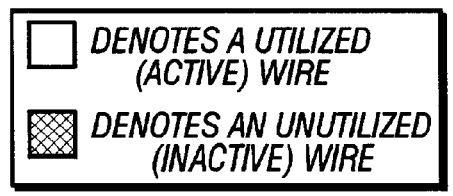
Figure 3D:
Figure 3D:
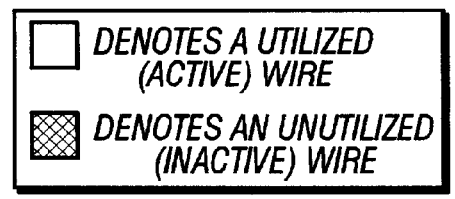
Figure 3E:
Figure 3F:
Figure 3G:
Figure 3H:
Figure 3I:
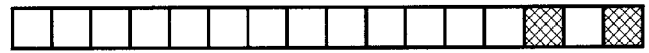
Figure 3J:
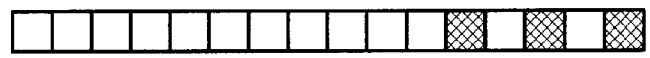
Figure 3K:
Figure 3L:
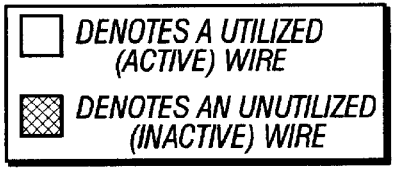
Figure 3L:
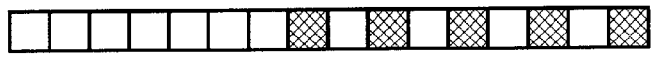
Figure 3M:
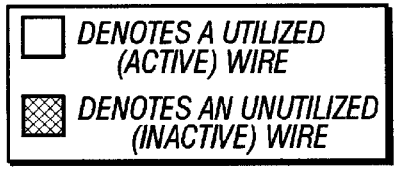
Figure 3M:
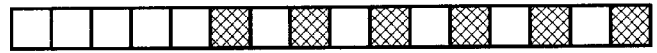
Figure 3N:
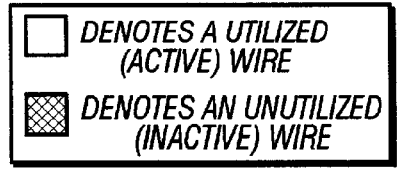
Figure 3N:
Figure 4A:
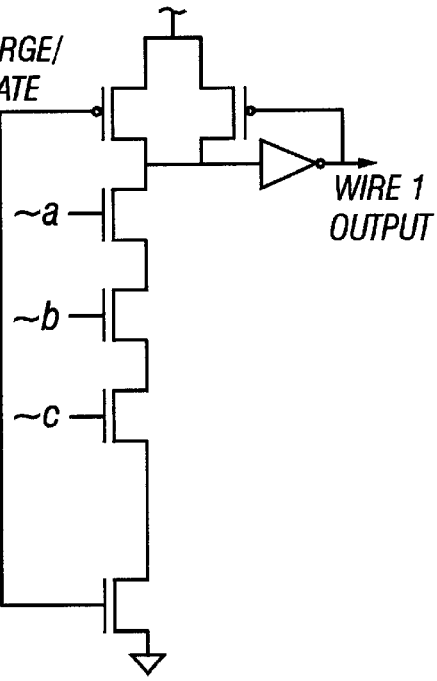
FIGS. 4A–4D show a physical implementation of the first four wires of the encoder 106, according to the embodiment of the present invention of FIG. 1.
Figure 4B:
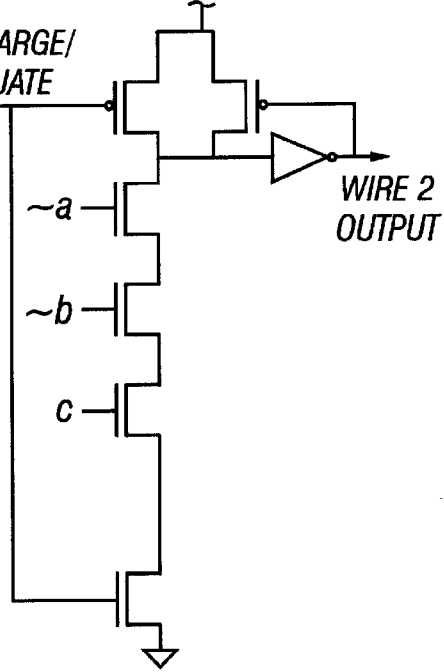
Figure 4C:
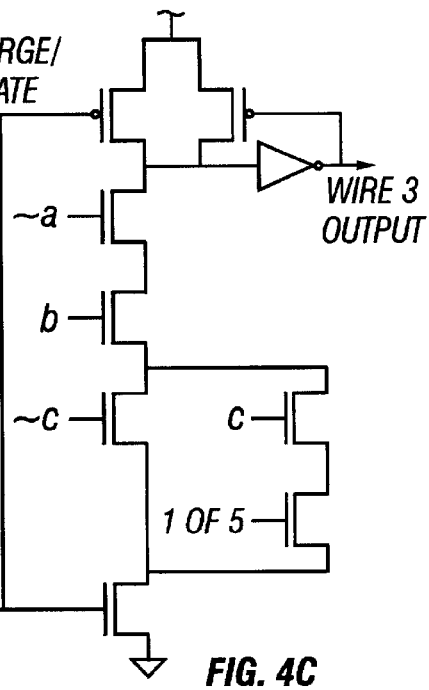
Figure 4D:
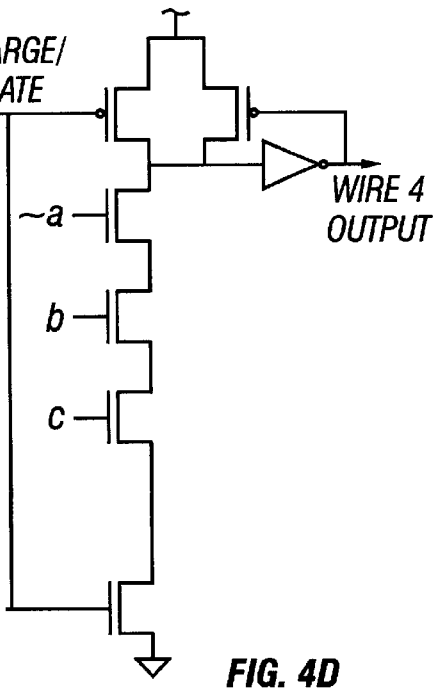

Referring now to FIGS. 3A through 3N, the encoding of a field within the pseudorandom pattern 118 to produce the corresponding field of the encoded pattern is illustrated. The encoder 106 selects one of the 14 functions illustrated in FIGS. 3A through 3N according to the corresponding field of the ROM entry 114.

As shown in FIGS. 3A and 3B, the value of the input bits belonging to the pseudorandom pattern field are identified as "a" and "b." As shown in FIG. 3A, a 1-of-3 encoding of a two-bit field of the pseudorandom pattern 118, implemented within a pitch of four wires, is shown. When a signal is 1-of-4, the signal can receive any possible two-bit value, once the value is converted to an N-nary format.

The value of the N-nary signal is zero when both "a" and "b" are zero, so the "0(1-of-4)" wire is pulled to a high voltage by the encoder in such a case. The value of the N-nary signal is one when "a" (the more significant bit) is zero and "b" (the less significant bit) is one, so the "1(1-of-4)" wire is pulled to a high voltage by the encoder in such a case. The value of the N-nary signal is two when "a" (the more significant bit) is one and "b" (the less significant bit) is zero, so the "2(1-of-4)" wire is pulled to a high voltage by the encoder in such a case. The value of the N-nary signal is three when both "a" (the more significant bit) and "b" (the less significant bit) are one , so the "3(1-of-4)" wire is pulled to a high voltage by the encoder in such a case.

Referring now to FIG. 3B, an encoding for a two-bit field of the pseudorandom pattern 118 into a 1-of-3 signal, implemented on a pitch of four wires, is shown. The value of the N-nary signal is zero when both "a" and "b" are zero, so the "0(1-of-3)" wire is pulled to a high voltage by the encoder in such a case. The value of the N-nary signal is one when "a" (the more significant bit) is zero and "b" (the less significant bit) is one, so the "1(1-of-4)" wire is pulled to a high voltage by the encoder in such a case. However, unlike the 1-of-4 signal, the value of the N-nary signal is two when "a" (the more significant bit) is one, regardless of the value of "b" (the less significant bit).

Referring now to FIG. 3C, a one of eight encoding implemented within a pitch of eight wires is shown. The corresponding field of the pseudorandom pattern 118 has three bits, identified as a, b, and c. Each possible combination of these values asserts exactly one of the eight wires.

Referring now to FIGS. 4A–4D, a physical implementation of the first four wires of the encoder 106 is shown. These structures are enabled when encoding factor is eight. Each of these structures illustrates the logical OR function of remapping, implemented as a NAND function.

Referring now to FIG. 3D, a one of seven encoding implemented within a pitch of eight wires is shown. The corresponding field of the pseudorandom pattern 118 has three bits, identified as a, b, and c. The first six wires respond to the bits of the pseudorandom pattern 118 as the first six wires of implementation of FIG. 3C. The seventh wire of FIG. 3D, however, is asserted when a and b have a value of 1, regardless of the value of c. In other words, the seventh wire includes a logical "OR" of the two cases when a and b have a value of 1: the case when c has a value of 0, and the case when c has a value of 1.

Referring now to FIG. 3E, a one of six encoding implemented within a pitch of eight wires is shown. As shown in FIG. 3E, six wires of the pitch are connected to corresponding wires of a one of six signal in the selected row. Two wires belonging to the pitch, however, are remapped through a logical OR operation to adjacent wires. Consequently, any possible value in the field of the pseudorandom pattern 118 is remapped to a legal one of N signal that selects one of the six wires in the corresponding N-nary signal.

FIG. 3E also shows an additional aspect of the present invention. Recall that the pseudorandom pattern 118 iterates through a large number of binary values. It might be expected that the first few such binary values would be mapped to distinct N-nary signals, and then all of the remaining binary values would be mapped to a single N-nary signal. However, as shown in FIG. 3E, the wires of the remapped condition are not adjacent. The implementation includes the first five wires and the seventh wire, rather than the first six wires. This nonadjacent implementation provides a more even distribution of signal occurrence frequency.

The nonadjacency of the conditions is also easier to implement than an adjacent condition, since only one type of OR-gate is needed. The entire structure may be implemented with two-input OR-gates. To implement the first six wires, rather than the first five wires and the seventh wire, would require additional logic gates. The sixth wire would implement a~bc|ab~c|abc, necessitating a three-input OR gate.

FIG. 3F shows a 1 of 5 encoding implemented within a pitch of eight wires. The 1 of 5 encoding uses only the first three wires that are "left justified" within the pitch of eight wires.

FIGS. 3G–3N show various encoding schemes implemented on a pitch of 16 wires. These encoding schemes use 9 to 16 wires. When less than all wires among the pitch of 16 wires are used, the wires that are used are generally left-justified, and any unused wires are interspersed among the rightmost "used" wires.

FIG. 3G shows a 1 of 16 encoding, using all 16 wires. FIG. 3H shows a 1 of 15 encoding, using the first 15 wires and not using the 16 wire of the pitch of 16 wires. FIG. 3I shows a 1 of 14 encoding, and FIG. 3J shows a 1 of 13 encoding. Likewise, FIG. 3K shows a 1 of 12 encoding, and FIG. 3L shows a 1 of 11 encoding. FIG. 3M shows a 1 of 10 encoding, and FIG. 3N shows a 1 of 9 encoding. Encodings with fewer than 9 wires can be implemented on a pitch of fewer than 9 wires. The pitch is a power of two, and when the wires that are used are fewer than all the wires in the pitch, lower wire positions within the pitch are generally preferred.

In summary, the present invention comprises a number transformer that includes an encoder that converts binary numbers to N-nary numbers. Within an N-nary number, exactly one of the bits has a value of one and all of the remaining bits have a value of zero. According to some aspects, several N-nary numbers are generated in response to a binary number. A set of encoding instance selectors defines a partitioning of the bits of the binary number and a range of bits within each partition. The encoder then converts each subset of bits of the binary number to a corresponding N-nary number, such that exactly one of the bits of each N-nary number has a value of one and all of the remaining bits of the N-nary number have a value of zero, and such that the one of the bits of each N-nary number having a value of one is within the range of bits defined by the corresponding encoding instance selector. The set of encoding instance selectors may define a test point within a circuit under test, and may be produced by an on-chip ROM.

According to another aspect of the invention, the present invention comprises a number transformer that includes at least one updatable parameter, for example a ring counter, that produces an N-nary number. The N-nary number has several bits, exactly one of which has a value of one and the remaining of which have a value of zero. The number transformer also includes a masker, configured to perform a bitwise boolean AND upon the first updatable parameter and a binary number. The binary number is obtained from a linear finite state machine operating as a pseudorandom pattern generator. When several ring counters are included, multiplexers are added to select one of the ring counters. The multiplexers are controlled by a ROM, that iterates through the various test points in a circuit under test.

Other embodiments of the invention will be apparent to those skilled in the art after considering this specification or practicing the disclosed invention. The specification and examples above are exemplary only, with the true scope of the invention being indicated by the following claims.

I claim the following invention:

1. A number transformer, comprising:
   a clocked pseudorandom pattern generator that produces a first n-bit binary number,
   at least one clocked updatable device that produces a second n-bit binary number wherein the ratio of ones to zeros within each said second n-bit binary number equals a preselected ratio;
   n multiplexers, each mutiplexer receives exactly one bit from each said clocked updatable device, wherein each said exactly one bit received by each said multiplexer occupies the same bit position within said second n-bit binary number produced by each clocked updatable device,
   a select signal coupled to each said multiplexer, said select signal selects one specific second n-bit binary number produced by one specific clocked updatable device and causes each said multiplexer to output the bit value of said second n-bit binary number, and
   n AND gates, each said AND gate receives exactly one bit from said pseudorandom pattern generator output and the bit that occupies the same bit position from said multiplexer, said n AND gates collectively output a third n-bit binary number having a ratio of ones to zeros that is either equal to or less than the ratio of ones to zeros within said one specific second n-bit binary number selected by said select signal.

2. The number transformer of claim 1, wherein said at least one updatable device is a ring counter having n states, said ring counter is up dated by shifting each bit value of said second n-bit binary number to the next more significant bit position and shifting the bit value of the most significant bit into the least significant bit position.

3. The number tansformer of claim 2 wherein each said ring counter further comprises a data input configured to receive a preselected n-bit binary number that defines said preselected ratio of ones to zeros within each said second n-bit binary number output by said ring counter.

4. The number transformer of claim 1 further comprising a ROM, when said select signal corresponds to one of a plurality of ROM entries within said ROM, each said ROM entry corresponds to a test point that stimulates a circuit block within logic under test.

5. The number transformer of claim 4, wherein said pseudorandom pattern generator, each said clocked updatable device, n multiplexers, n AND gates, ROM entry, and select signal operate synchronously, such that a third n-bit binary number having a ratio of ones to zeros that is either equal to or less than the ratio of ones to zeros within said one specific second n-bit binary number selected by said select signal is produced every clock cycle.

6. A system that transforms numbers, comprising:
   a clocked pseudorandom pattern generator that produces a first n-bit binary number,
   at least one clocked updatable device that produces a second n-bit binary number wherein the ratio of ones to zeros within each said second n-bit binary number equals a preselected ratio;
   n multiplexers, each multiplexer receives exactly one bit from each said clocked updatable device, wherein each said exactly one bit received by each said multiplexer occupies the same bit position within said second n-bit binary number produced by each clocked updatable device,
   a select signal coupled to each said multiplexer, said select signal selects one specific second n-bit binary number produced by one specific clocked updatable device and causes each said n multiplexer to output the bit value of said second n-bit binary number, and
   n AND gates, each said AND gate receives exactly one bit from said pseudorandom pattern generator output and the bit that occupies the same bit position from said multiplexer, said n AND gates collectively output a third n-bit binary number having a ratio of ones to zeros that is either equal to or less than the ratio of ones to zeros within said one specific second n-bit binary number selected by said select signal.

7. The system of claim 6, wherein said at least one updatable device is a ring counter having n states, said ring counter is updated by shifting each bit value of said second n-bit binary number to the next more significant bit position and shifting the bit value of the most significant bit into the least significant bit position.

8. The system of claim 7 wherein each said ring counter further comprises a data input configured to receive a preselected n-bit binary number that defines said preselected ratio of ones to zeros within each said second n-bit binary number output by said ring counter.

9. The system of claim 6 further comprising a ROM, wherein said select signal corresponds to one of a plurality of ROM entries within said ROM, each said ROM entry corresponds to a test point that stimulates a circuit block within logic under test.

10. The system of claim 9, wherein said pseudorandom pattern generator, each said clocked updatable device, n multiplexes n AND gates, ROM entry, and select signal operate synchronously, such that a third n-bit binary number having a ratio of ones to that is either equal to or less than the preselected ratio of ones to zeros within said one specific second n-bit binary number selected by said select signal is produced every clock cycle.

11. A method that makes a number transformer, comprising:

provideng a clocked pseudorandom pattern generator that produces a first n-bit binary number, providing at least one clocked updatable device that produces a second n-bit binary number wherein the ratio of ones to zeros within each said second n-bit binary number equals a preselected ratio;

providing n multiplexers, each multiplexer couples to and receives exactly one bit from each said clocked updatable device, wherein each said exactly one bit received by each said multiplexer occupies the same bit position within said second n-bit binary number produced by each clocked updatable device, coupling a select signal to each said multiplexer, said select signal selects one specific second n-bit binary number produced by one specific clocked updatable device and causes each said multiplexer to output the bit value of said second n-bit binary number, and providing n AND gates, each said AND gate couples to and receives exactly one bit firm said pseudorandom pattern generator output and the multiplexer output bit that occupies the same bit position, said n AND gates collectively output a third-bit binary number having a ratio of ones to zeros that is either equal to or less than the ratio of ones to zeros within said one specific second n-bit binary number selected by said select signal.

12. The method of claim 11, wherein said at least one updatable device is a ring counter having n states, said ring counter is updated by said ring each bit value of said second n-bit binary number to the next more significant bit position and shifting the bit value of the most significant bit into the least significant bit position.

13. The method of claim 12, further comprising coupling to said ring counter a data input configured to receive a preselected n-bit binary number that defines said preselected ratio of ones to zeros within each said second n-bit binary number output by said ring counter.

14. The method of claim 11 further comprising providing a ROM, wherein said select signal corresponds to one of a plurality of ROM entries with in said ROM, each said ROM entry corresponds to a test point that stimulates a circuit block within logic under test.

15. The method of claim 14, wherein said pseudorandom pattern generator, each said clocked updatable device, n multiplexers, n AND gates, ROM entry, and select signal operate synchronously, such that a third n-bit binary number having a ratio of ones to zeros that is either equal to or less than the ratio of ones to zeros within said one specific second n-bit binary number selected by said select signal is produced every clock cycle.

16. A method that transforms numbers, comprising:

generating a first n-bit binary number, producing at least one second n-bit binary number using at least one clocked updatable device, wherein the ratio of ones to zeros within each said second n-bit binary number equals a preselected ratio;

selecting one specific second n-bit binary number;

performing a bitwise boolean AND on said first n-bit binary number and said selected one specific second n-bit binary number to produce a third n-bit binary number having a ratio of ones to zeros that is either equal to or less than the ratio of ones to zeros within said one specific second n-bit binary number.

17. The method of claim 16, further comprising up dating each said second n-bit binary number produced by shifting each bit value of each said second n-bit binary number to the next more significant bit position and shifting the bit value of the most significant bit into the least bit position.

18. The method of claim 17, further comprising providing to each said clocked updatable device a preselected n-bit binary number that defines said preselected ratio of ones to zeros within each said second n-bit binary number produced by each said clocked updatable device.

19. The method of claim 16 wherein selecting one specific second n-bit binary number further comprises providing a select signal to n multiplexers, said select signal corresponds to a ROM entry from a ROM, wherein said ROM entry corresponds to a test point that stimulates circuit block within logic under test.

20. The method of claim 19, wherein generating said first n-bit binary number, producing and selecting said second n-bit binary number, and performing said bitwise boolean AND operation are performed synchronously, such that a third n-bit binary number having a ratio of ones to zeros that is either equal to or less than the preselected ratio of ones to zeros within said one specific second n-bit binary number selected by said select signal is produced every clock cycle.

* * * * *